United States Patent [19]

Inuiya

[11] Patent Number: 4,641,169
[45] Date of Patent: Feb. 3, 1987

[54] SOLID-STATE IMAGE PICKUP DEVICE WITH SELECTIVE OUTPUT CHARACTERISTICS AND IMAGING APPARATUS USING SAME

[75] Inventor: Masafumi Inuiya, Kaisei, Japan

[73] Assignee: Fuji Photo Film Co., Ltd., Kanagawa, Japan

[21] Appl. No.: 688,202

[22] Filed: Jan. 2, 1985

[30] Foreign Application Priority Data

Jan. 19, 1984 [JP] Japan .................................. 59-6354

[51] Int. Cl.$^4$ ...................... H01L 27/14; H01L 31/00
[52] U.S. Cl. ........................................ 357/30; 357/24; 357/45; 358/212; 358/213
[58] Field of Search ................ 357/30, 31, 24 LR, 45, 357/16; 358/212, 213

[56] References Cited

U.S. PATENT DOCUMENTS 4,323,912  4/1982  Koike et al. ........................... 357/31

Primary Examiner—William L. Sikes
Assistant Examiner—Georgia Y. Epps
Attorney, Agent, or Firm—Birch, Stewart, Kolasch & Birch

[57] ABSTRACT

An imaging apparatus includes a solid-state image pickup device having an array of photosensitive cells formed on a semiconductor substrate, and reading circuitry for sequentially reading out video signals from the cells. Each photosensitive cell has a junction portion formed on the substrate for storing photocarriers, a metal layer for collecting photocarriers to the junction portion, a photoconductive layer formed on the metal layer for generating photocarriers associated with an incident light, and a transparent electrode layer formed on the photoconductive layer and including an electrically conductive substance transparent with respect to light. The apparatus further includes a power supply unit for supplying a variable bias voltage to the transparent electrode layer. The value and polarity of the bias voltage is variable so that an output characteristic of the video signals can be adjusted.

9 Claims, 7 Drawing Figures

SOLID-STATE IMAGE PICKUP DEVICE WITH SELECTIVE OUTPUT CHARACTERISTICS AND IMAGING APPARATUS USING SAME

BACKGROUND OF THE INVENTION

1. Field of the Invention

The present invention relates to a solid-state image pickup device, and in particular, to a solid-state image pickup device which includes photosensitive cells formed in a laminated layer of a photoconductive material such as amorphous semiconductor, and imaging apparatus using such a device.

2. Description of the Prior Art

A solid-state image pickup device does not possess an extensive dynamic range where an output current therefrom is proportional to the intensity of a light incident to the image pickup device. This restriction causes a problem when taking pictures of various objects under differing conditions.

In a microfilm reader for projecting a picture of a frame recorded on microfilm onto a screen in a magnified scale, for example, if a solid-state image pickup device is utilized, complex and sophisticated signal processing electronics are required to obtain video signals most suitable for displaying the picture. In general, a silver-halide photosensitive film, a diazo-compound photosensitive film, or the like may be used for a microfilm. Usually, most silver-halide films have negative images recorded thereon, whereas diazo-compound films contain positive images obtained by copying images carried on a silver-halide film placed fixedly on the diazo-compound film in ordinary cases. Consequently, microfilms contain either negative or positive images. In addition, pictures recorded on microfilm may be of various gradations, for example, of a text on which characters and other symbols are written, and a picture having intermediate gray scale gradations.

In order to shoot images recorded on a microfilm, containing such various pictures as described above with a solid-state imaging device to obtain video signals suitable for display, a signal processing circuit is required which includes contrast conversion of images from hard to soft, or vice versa, as well as inversion of images from negative to positive, or vice versa (positive/negative conversion). This signal processing necessitates complicated circuits for performing a variable gamma ($\gamma$) correction to be conducted on a signal delivered from the image pickup device, for inverting the level of the output signal, and for executing associated operations.

Since spectral transmission characteristics are different between a silver-halide film and a diazo-compound film, the spectral sensitivity characteristics of the solid-state image pickup device must be variable to obtain video signals suitable for display.

In addition, it has been desired, when transmitting manuscripts or printed matter having various colors by such a transmitter device as a facsimile, to emphasize characters written in red or to copy a blue background into a white portion background, for example. These requirements can be satisfied with an image pickup device which has variable spectral sensitivity characteristics.

On the other hand, a solid-state image pickup device having photosensitive cells formed by a photosensitive material such as an amorphous semiconductor or the like in a layer-built structure has a large numerical aperture with respect to an incident light, and thus has a high sensitivity, so that the degree of freedom in designing the spectral sensitivity could be increased and the frequency range in which the device is sensitive could be quite wide. Moreover, the blooming phenomena can be effectively suppressed. The present invention accordingly facilitates construction of a camera having variable gradation characteristics covering the operation on the contrast of output video signals and the conversion between the negative and positive images, and having variable spectral sensitivity characteristics based on the characteristics of the image pickup device described above.

The words "output characteristics" should be appreciated in the broadest sense, that is, they also imply those associated with the negative/positive conversion and spectral sensitivity in addition to the difference in the optical density alone.

SUMMARY OF THE INVENTION

It is therefore an object of the present invention to provide a solid-state image pickup device having variable output characteristics with respect to the video signals produced therefrom without utilizing complex circuit means, thereby removing above-stated drawbacks of the prior art.

It is also an object of the present invention to provide imaging apparatus using such an image pickup device with variable output characteristics.

In accordance with the present invention, there is provided imaging apparatus including a solid-state image pickup device having an array of a plurality of photosensitive cells formed on a semiconductor substrate, and reading means for sequentially reading out video signals from the plurality of photosensitive cells. Each of said photosensitive cells according to the teaching of the present application has a junction portion formed on the substrate for storing photocarriers generated, a metal layer for collecting photocarriers to the junction portion, a photoconductive layer formed on the metal layer for generating photocarriers associated with an incident light, and a transparent electrode layer formed on the photoconductive layer and including an electrically conductive substance which is substantially transparent with respect to light. The apparatus of the present application further includes power supply means for supplying a bias voltage to the transparent electrode layer, the bias voltage having at least one value or polarity of the variable so that an output characteristic of the video signals can be adjusted.

In accordance with an aspect of the present invention, the photoconductive layer is formed so thin that an incident light having a relatively longer wavelength is allowed to reach the junction, and the metal layer may have an optical opening formed at least partially in a position associated with the junction.

In accordance with the present invention, a solid-state image pickup device comprises a semiconductor substrate, an array of a plurality of photosensitive cells formed on the substrate, and reading means formed on the substrate for selecting the photosensitive cells to produce video signals associated with light incident to the array. Each of said photosensitive cells includes a junction portion formed on the substrate for storing therein photocarriers, a layer of metal interconnected to said junction portion, a layer of photoconductive material formed on said metal layer to generate therein photocarriers associated with the incident light, and a layer of electrically conductive material formed on said photoconductive layer to form an electrode for receiving a bias voltage. The electrically conductive material of the electrode is substantially transparent with respect to the incident light, so that the image pickup device produces video signals which are adjustable in output characteristics in response to the value or polarity of the bias voltage.

BRIEF DESCRIPTION OF THE DRAWINGS

The objects and features of the present invention will become more apparent from the consideration of the following detailed description taken in conjunction with the accompanying drawings in which.

DESCRIPTION OF THE PREFERRED EMBODIMENT

An embodiment utilizing a solid-state image pickup device of the present invention will be described in detail by referring to the accompanying drawings.

Figure 1:
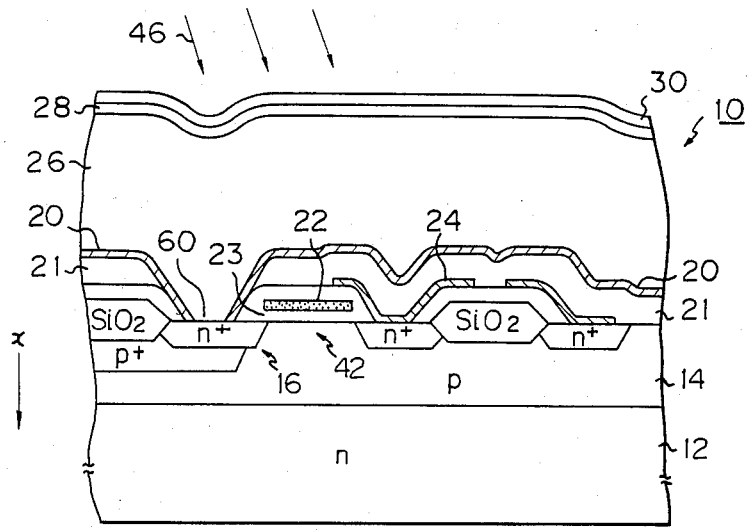
FIG. 1 is a conceptual, vertical cross-sectional view showing an example of a photosensitive cell in a solid-state image pickup device utilizing an amorphous layer as a photoconductive layer in accordance with the present invention.

FIG. 1 is a conceptual, vertical cross-sectional view showing a photosensitive cell 10 of an example of a solid-state image pickup device in which a layer of amorphous semiconductor is utilized as a photoconductive layer. In this example, a photocarrier storage diode 16 is formed on a p-type epitaxial layer 14 epitaxially grown on a primary surface of an n-type silicon substrate 12. As depicted in FIG. 1, an electrode layer 20 made of a metal such as aluminum is formed thereon with an insulating material layer 21 disposed therebetween. A polycrystalline layer 22, separated by an insulating material layer 23, constitutes an MOS switching element 42, while a second aluminum layer 24 forms an output line for reading a video signal out from the diode 16.

A semiconductor layer 26 made of an amorphous substance is grown on the aluminum layer 20 in order to configure a photoconductive layer. In addition to the amorphous silicon hydrade (a-Si:H), a ZnSe-ZnCdTe layer, a Se-As-Te layer, or the like is utilized to form a photoconductive layer. The layer 26 having a high conductivity is slightly thinner than the prior art image pickup devices of this kind, and the thickness is advantageously set to a value which allows a part of an incident light beam 46 to reach the pn junction of the diode 16 so that the photodiode can function with photocarriers excited therein.

A transparent electrode 28, made of a material such as ITO ($In_2O_3$-$SnO_2$), is formed on the photoconductive layer 26, which may be provided thereon with a color filter 30 if required.

For the metal layer 20, an opening is formed at least partially in a portion above the diode 16, and the thickness is advantageously set to be quite small. In more detail, the optical opening is formed in the portion 60 so that a part of an incident light beam 46 passes through this portion 60 to reach the pn junction of the diode 16. The term "optical opening" used in this specification covers the portions which are transparent or semitransparent with respect to light and portions having a thickness which is small enough to allow light to pass therethrough in addition to the mechanically opened portions.

As described above, the photoconductive layer 26 is thinner and the optical opening 60 is disposed in the metal layer, and hence a light having a wavelength associated with a small absorption coefficient in the conductive layer 26, namely, a light having a longer wavelength in the range of red light can reach the pn junction of the diode 16 so as to stimulate photocarriers.

Figure 2:
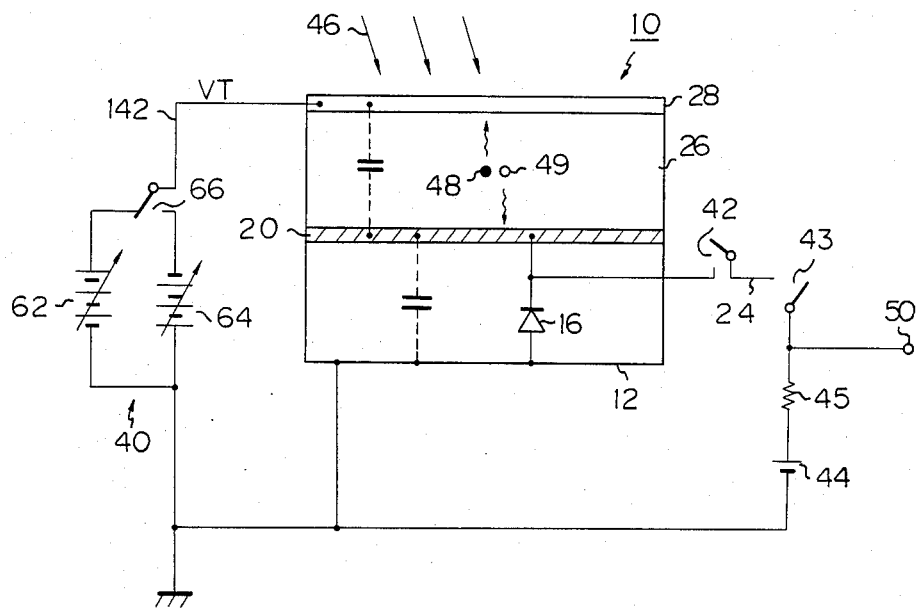
FIG. 2 is a schematic circuit diagram depicting an equivalent circuit of the photosensitive cell of FIG. 1.

FIG. 2 is an equivalent circuit diagram depicting the photosensitive cell 10 of FIG. 1. As can be seen from this circuit diagram, the substrate 12 is grounded and the transparent electrode 28 is biased with a positive or negative potential from a direct current (dc) power supply 40. The power supply 40 includes a direct current power supply 62 connected in one polarity and a direct current power supply 64 connected in the other polarity. One of these dc power supplies is linked with the transparent electrode 28 through a changeover contact 66 in order to apply thereto a bias voltage VT. The value of supply voltage applied from the power supply 62 or 64 can also be manually changed as illustrated in FIG. 2. As will become clear from the description to be given later, the power supply 40 includes indicating means for indication the gradation characteristics such as those associated with the negative/positive conversion on the video signals delivered from an image pickup device and the contrast adjustment on such signals.

The diode 16 has a cathode connected to a video power supply 44 via readout switches 42 and 43 and a load resistor 45. Although the switch 42 is conceptually depicted in the form of a contact point, an MOS switching element shown in FIG. 1 is also applicable. This is also the case for the switch 43. In an actual case, the photosensitive cells 10 are arranged to form an array comprising rows and columns; consequently, a photosensitive cell is connected to an MOS switching element 42 for selecting a horizontal row, and to an MOS switching element 43 for selecting a vertical column, each being connected in series when represented in an equivalent circuit diagram. Without using such an MOS structure, it is also applicable to form electric charge transfer paths in a charge-coupled device structure.

In the solid-state image pickup device 10 having above-mentioned photosensitive cells formed with amorphous semiconductor in a layer-built structure, if a positive potential is applied to the transparent electrode 28 with the switch 66 set to the connecting position depicted in FIG. 2, that is, when the bias voltage VT is positive, the electrons 48 among the photocarriers excited in the photoconductive layer 26 by the light 46 incident to the photoconductive layer 26 are fed toward the transparent electrode 28, while the holes 49 are captured by the aluminum layer 20 to be delivered to the storage diode 16 so as to be stored in the pn junction thereof. When the readout switches 42 and 43 are closed, a current associated with the carriers stored in the diode 16 flows to be delivered as an output video signal to an output terminal 50.

In this embodiment, as described before, the photoconductive layer 26 is formed in such a manner that the thickness thereof is so small as to allow an incident light having a longer wavelength to pass through the optical opening 60 to reach the diode 16. That is, a light having the longer wavelength which is in the neighborhood of the range of red light is allowed to enter the diode 16 more effectively in order to generate photocarriers. A light having a wavelength outside the range of the red light excites photocarriers mainly in the photoconductive layer 26. This phenomenon is accomplished by advantageously using the characteristics that the amorphous silicon mainly absorbs the light having a shorter wavelength than about 800 monometers, and that the pn junction has a photosensitive range whose peak region has its center associated with a frequency higher than that belonging to the light absorption range described above.

If the bias voltage VT is positive, for example, the holes 49 among the carriers excited in the photoconductive layer 26 are transferred to the diode 16. In this case, distance 1 over which such a carrier proceeds without being recombined with another electric charge of opposite polarity is determined, as known widely, by the product of mobility $\mu$ and life time $\tau$ of the carrier, and electric field E generated by the bias voltage VT; consequently, the stronger the electric field E is, the longer the distance 1 becomes.

This means that the amount of the holes that reach the diode 16 increases as the electric field E is strengthened. The ratio of the carriers that reach the diode 16 in the photocarriers excited in the conductive layer by the incident light 46 can be varied accordingly by changing the bias voltage VT. That is, the incident light sensitivity characteristics of the photosensitive cell 10 can be changed with respect to the incident light having a wavelength of other than the light of the longer wavelength. A wavelength selectivity is realized in which the sensitivity is made variable by changing the bias voltage VT for the blue (B) and green (G) light wavelength range. Even if the bias voltage VT is negative, the above description is also applicable to the variable sensitivity function having the wavelength selectivity only with the words referred to the holes substituted for those referred to the electrons with each other.

When the bias voltage VT is set to be negative, however, it should be noted that the operations are interchanged between the holes and electrons among the photocarriers. That is, even if the magnitude of the incident light 46 to the photosensitive cell is the same, the polarity of the signal current produced from the output terminal 50 is inverted when the bias voltage VT is positive, thereby realizing the negative/positive inverting function.

Figure 3:
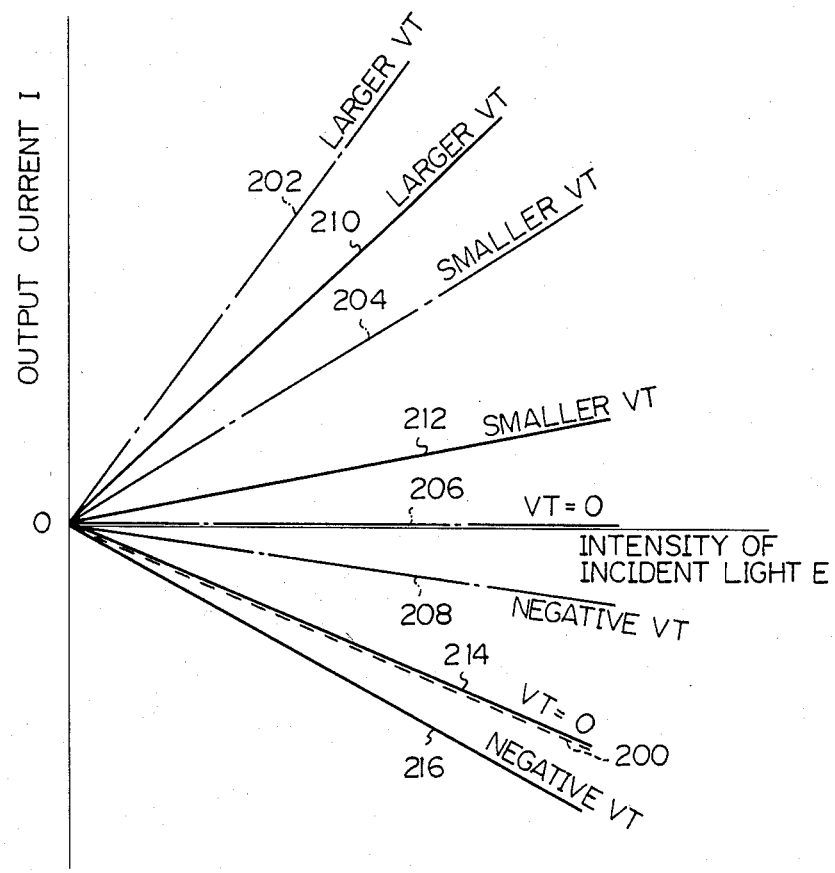
FIG. 3 illustrates a graph useful for understanding the fundamental principle of the present invention.

This operation will be more specifically described with reference to FIG. 3. A current I caused by photocarriers excited in the pn junction portion of the diode 16 by the incident light does not depend on the bias voltage VT as indicated by a dot line 200. However, a current generated by photocarriers excited in the photoconductive layer 26 by the incident light depends on the bias voltage VT as represented by dot-chain lines 202, 204, and 206. It changes more greatly, that is, it develops a higher sensitivity as the bias voltage increases. Consequently, the total output current I created as a result is obtained as indicated by solid lines 210, 212, and 214. That is, the sensitivity of the photosensitive cell 10 can be changed in accordance with the bias voltage VT.

If the bias voltage VT is lowered to a certain value, or if the absolute value of the photoelectric current obtained by exciting photocarriers in the photoconductive layer 26 is lower than that of the photocurrent (indicated by a dot line 200) generated as a result of photocarrier excitation in the diode 16, the direction of the total output current is inverted. This phenomenon will be clear from FIG. 3 in which the photoelectric current generated in the photoconductive layer 26 is 0 as represented by a dot-chain line 206, and the total output current consists of only the photocurrent excited in the diode 16 to flow in the opposite direction.

When the polarity of the bias voltage VT is inverted, the direction of the photocurrent I generated in the pn junction portion of the diode 16 is not changed, but the photocurrent I excited in the photoconductive layer 26 changes its direction as represented by a dot-chain line 208. Consequently, the resultant total output current I is inverted as depicted by a solid line 216.

As described hereinabove, the direction of the total output current is inverted by lowering the value of bias voltage VT to a certain extent, or by inverting the polarity of bias voltage VT, thereby realizing the negative/positive inverting function.

Figure 4:
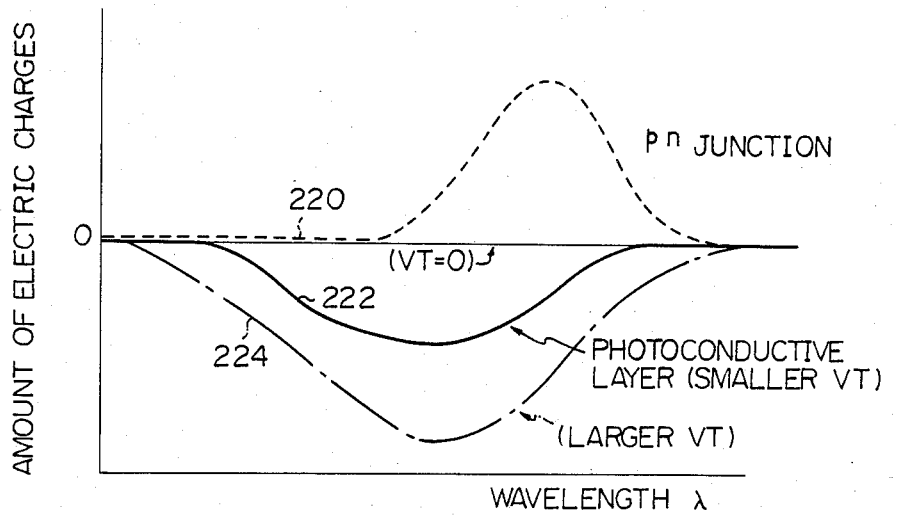
FIGS. 4 and 5 are graphs useful for understanding embodiments of the present invention.

Next, the fundamental principle of an image pickup device having a variable spectral sensitivity characteristics in accordance with the present invention will be described by referring to FIGS. 4 and 5. FIG. 4 is a graph conceptually depicting the spectral sensitivity characteristics with respect to the photocarriers excited by the incident light in the pn junction portion of the diode 16 and in the photoconductive layer 26. The spectral sensitivity characteristics, represented by a dot line 220, in the pn junction of the diode 16 are constant as described before regardless of the value of bias voltage VT. Although this is the case for the spectral characteristics in the photoconductive layer 26, the absolute value is different between a lower bias voltage VT, indicated by a solid line 222, and a higher bias voltage VT, represented by a dot-chain line 224, as explained hereabove. Consequently, the spectral sensitivity characteristics of the output current I obtained as the total of the photocarriers generated in the pn junction portion of the diode 16 and those excited in the photoconductive layer 26 vary depending on the value of the bias voltage VT.

Figure 5:
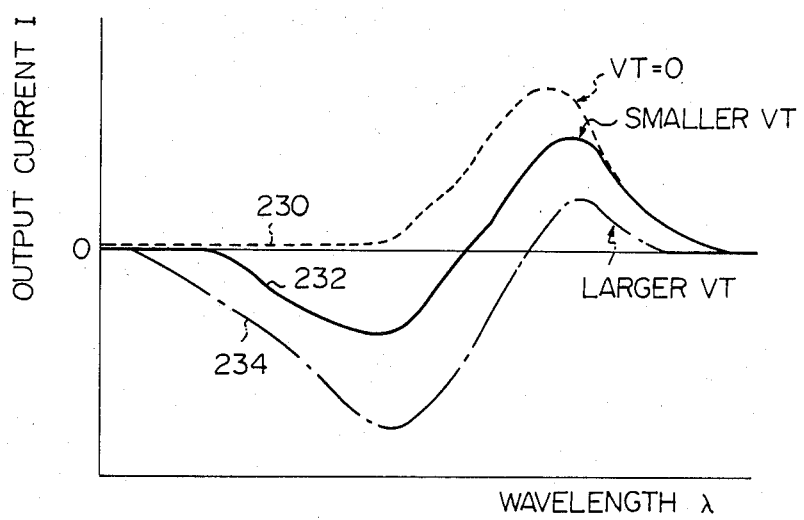

FIG. 5 is a graph showing the spectral sensitivity characteristics of the output current I generated based on the spectral sensitivity characteristics of the pn junction of the diode 16 and the photoconductive layer 26 depicted in FIG. 4. Although the output current I matches with the spectral sensitivity characteristic, indicated by a dot line, of the pn junction of the diode 16 when the value of the bias voltage VT is 0, the characteristics vary for a smaller bias voltage VT, presented by a solid line 232, and a greater bias voltage VT, indicated by a dot-chain line 234. That is, the spectral sensitivity characteristics can be arbitrarily changed by using a variable bias voltage VT.

Figure 6:
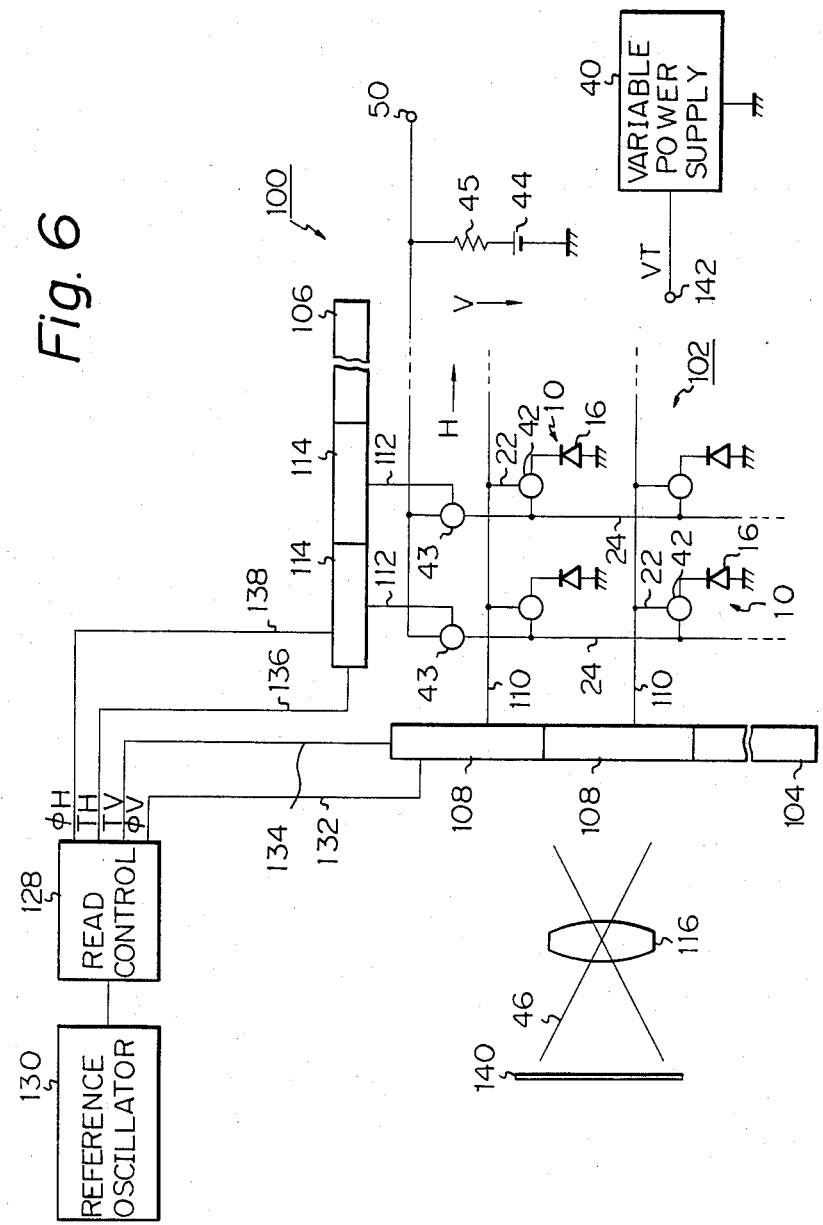
FIG. 6 depicts a schematic block diagram of an embodiment in which imaging apparatus of the present invention is applied to a microfilm reader.

FIG. 6 depicts an embodiment in which imaging apparatus of the present invention is applied to a microfilm reader. The main section thereof is a solid-stage image pickup device 100 which is formed on a chip and comprises a photosensitive cell array 102 having rows and columns formed with photosensitive cells of FIG.

1, a vertical shift register 104, and a horizontal shift register 106. For example, the photosensitive cell array 102 comprises the photosensitive cells disposed in a matrix formed by 242 horizontal scanning lines in a vertical direction V and 256 picture elements, or pixels, in the horizontal direction H, and hence the shift registers 104 and 106 are each provided with the corresponding number of register stages.

Figure 7:
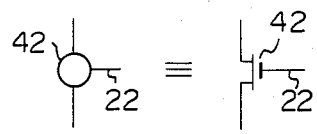
FIG. 7 is an explanatory representation of the circuit element symbols used in FIG. 6.

Each register stage 108 of the vertical shift register 104 is used to drive the associated horizontal row select line 110, which is each connected to a gate 22 of the switch 42. Although the switch 42 is, like the switch 43, configured with an MOS switch as shown in FIG. 7 in this embodiment, it is represented with a small circle in FIG. 6 to simplify the schematic circuit diagram. A source-drain path has an end connected to the diode 16, and has the other end connected to the vertical line, that is, video signal readout line 24.

The vertical lines 24 are commonly connected to the video signal output terminal 50 via the source-drain paths of the MOS switches 43 respectively on a vertical column basis. The MOS switch 43 has a gate 112 connected to a register stage associated with the horizontal shift register 106.

In the explanatory embodiment of FIG. 6, a monochrome image pickup device comprises an photosensitive cell array in which the photosensitive cells are arranged along the rows and columns. Although this embodiment is enough to understood the principle of the present invention, it need not be mentioned that the present invention is effectively applicable to a color image pickup device.

On the other hand, the imaging apparatus is provided with an image pickup lens 116 for focusing an image of an object 140 on the photosensitive cell array 102 of the image pickup device 100. The object 140 is a microfilm in this embodiment, and a frame thereof is shot by use of the lens 116, for example.

A read control circuit 128 drives the solid-state image pickup device 100 by generating various timing signals from the reference clock signal supplied from a reference oscillator 130. The read control circuit 128 delivers a stepping clock $\phi V$ and a driving pulse TV to the vertical shift register 104 on signal lines 132 and 134, respectively; furthermore, it supplies the horizontal shift register 106 with a stepping clock $\phi H$ and a driving pulse TH over signal lines 134 and 136, respectively.

In the present embodiment, a video signal is produced from the output terminal 50 at a signal rate conforming to the standard television format. Consequently, the stepping clock $\phi V$ is used to cause a stepping operation for register stages 108 of the vertical shift register 104 at the intervals of a horizontal scanning time period (H), while the stepping clock $\phi H$ enables each register stage 114 of the horizontal shift register 106 to conduct a shifting operation at the intervals of a pixel time period. Although these clock signals $\phi V$ and $\phi H$ are each represented with a single signal line in the figure, a two-phase clock signal is advantageously utilized in practice.

In FIG. 6, a connecting terminal to the transparent electrode 28 is shown by the reference numeral 142, to which connected is a variable power supply 40. The power supply 40 is configured as depicted in FIG. 2, and can supply the transparent electrode 28 with the variable dc voltage VT having a positive or negative polarity. Consequently, the variable contrast function and negative/positive inverting function, described before, are implemented by changing the level or polarity of the output voltage VT from the power supply circuit 40.

The embodiments explained hereinabove are demonstrated only for describing the present invention, and they should not be understood to restrict the present invention. It is to be appreciated that those skilled in the art can change or modify the embodiments without departing from the scope and spirit of the present invention. For example, although only the light having the longer wavelength selectively gets to the pn junction of the diode 16 so as to obtain a variable spectral sensitivity characteristics in the configuration of the photosensitive cell, a portion of the photoconductive layer over the diode 16 may be removed to provide an optical opening for passing the light having an arbitrary wavelength.

In accordance with the present invention, the contrast information of the output video signal is varied by changing the magnitude of the voltage applied to the photoconductive layer of the solid-state image pickup device, and the negative/positive conversion is implemented by use of the voltage polarity change which causes the level of output video signal to be inverted. Accordingly, the $\gamma$ correction and negative/positive conversion circuits which have been configured in complex and sophisticated circuits, respectively in the prior art, need not be provided in the output section of the solid-state image pickup device.

The spectral sensitivity of the output video signal can be varied if the thickness of the photoconductive layer is small enough to allow the red light to reach the pn junction.

If a camera constructed according to the teachings of the present invention is applied to an apparatus such as a line sensor utilized in a microfilm reader, a facsimile, or the like, the images recorded under various shooting conditions can be always reproduced as the pictures in the suitable display state.

While the present invention has been described with reference to the particular illustrative embodiment, it is not to be restricted by the embodiment but only by the appended claims. It is to be appreciated that those skilled in the art can change or modify the embodiment without departing from the scope and spirit of the present invention.

What is claimed is:

1. A solid-state image pickup device comprising:
a semiconductor substrate;
an array of a plurality of photosensitive cells formed on the semiconductor substrate;
reading means formed on said substrate for selectively reading said plurality of photosensitive cells to produce video signals associated with light incident to the array;
each of said photosensitive cells including,
a junction portion formed on said substrate for storing therein photocarriers,
a layer of metal formed over said substrate and interconnected to said junction portion to collect photocarriers to said junction portion, said layer of metal having an optical opening over at least part of said junction portion to allow incident light access thereto,
a layer of photoconductive material formed on said metal layer to generate therein photocarriers associated with the incident light, and
a layer of electrically conductive material formed on said photoconductive layer to form an electrode for receiving a bias voltage, said electrically conductive material being substantially transparent with respect to the incident light; and means for varying the value or polarity of said bias voltage to adjust the output characteristics of said video signal.

2. A device according to claim 1 wherein,
said photoconductive layer is formed so thin that an incident light having a relatively longer wavelength is allowed to reach said junction portion.

3. Imaging apparatus comprising:
a solid-state image pickup device having an array of a plurality of photosensitive cells formed on a semiconductor substrate; and
reading means for sequentially reading out video signals from said plurality of photosensitive cells;
each of said photosensitive cells including,
  a junction portion formed on said substrate for storing photocarriers generated,
  a metal layer formed over said semiconductor substrate for collecting photocarriers to said junction portion, said metal layer having an optical opening over at least part of said junction portion to allow incident light access thereto,
  a photoconductive layer formed on said metal layer for generating photocarriers associated with an incident light, and
  a transparent electrode layer formed on said photoconductive layer and including an electrically conductive substance which is substantially transparent with respect to light;
said apparatus further comprising power supply means for applying a bias voltage to said transparent electrode layer, said power supply means being adjustable to vary at least one of a value and a polarity of said bias voltage so that an output characteristic of said video signals may be adjusted.

4. Apparatus according to claim 3 wherein,
said photoconductive layer is formed so thin that an incident light having a relatively longer wavelength is allowed to reach said junction portion.

5. An imaging apparatus for developing a video signal representative of an image supplied thereto comprising:
a solid-state image pickup device having an array of a plurality of photosensitive cells monitoring an image to be reproduced;
each said photosensitive cell comprising:
  a photoconductive layer sensitive to incident light,
  a photoconductive junction disposed under said photoconductive layer so that all incident light supplied to said photoconductive junction passes through said photoconductive layer, said photoconductive junction being sensitive to light reaching said junction,
  electrode means for supplying a bias voltage across said photoconductive layer and photoconductive junction;
reading means, operatively connected to each said photosensor for sequentially accessing said photosensitive cells to read out a video signal therefrom; and
variable voltage supply means, operatively connected to said electrode means of each said photosensitive cell, to supply said bias voltage thereto, said bias voltage being varied in polarity so as to facilitate the read out of a video signal representative of a positive or negative representation of the image supplied thereto.

6. The imaging apparatus of claim 5 wherein the bias voltage supplied by said variable voltage supply is varied in magnitude to vary the spectral sensitivity of said apparatus.

7. The imaging apparatus of claim 5 wherein said photoconductive junction is formed over a semiconductor substrate.

8. The imaging apparatus of claim 7 wherein said reading means includes at least one output channel formed in said semiconductor substrate, each said photosensitive cell being adjacent a said output channel.

9. The apparatus of claim 6 wherein said variable voltage supply means varies the magnitude of the bias voltage to develop either a positive or negative representation of the image supplied thereto.

* * * * *